(12) United States Patent
Choi

(10) Patent No.: US 12,243,846 B2
(45) Date of Patent: Mar. 4, 2025

(54) BONDING WIRE, SEMICONDUCTOR PACKAGE INCLUDING THE SAME, AND WIRE BONDING METHOD

(71) Applicant: SAMSUNG ELECTRONICS CO., LTD., Suwon-si (KR)

(72) Inventor: Keun-ho Choi, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 538 days.

(21) Appl. No.: 17/380,276

(22) Filed: Jul. 20, 2021

(65) Prior Publication Data

US 2021/0351153 A1 Nov. 11, 2021

Related U.S. Application Data

(62) Division of application No. 16/361,339, filed on Mar. 22, 2019, now Pat. No. 11,094,666.

(30) Foreign Application Priority Data

Sep. 28, 2018 (KR) .......................... 10-2018-0116580

(51) Int. Cl.
*H01L 23/00* (2006.01)
*H01L 23/31* (2006.01)
(Continued)

(52) U.S. Cl.
CPC .......... *H01L 24/49* (2013.01); *H01L 23/3128* (2013.01); *H01L 23/481* (2013.01);
(Continued)

(58) Field of Classification Search
CPC . H01L 2224/73207; H01L 2224/73257; H01L 2224/48157; H01L 2224/48476; H01B 9/026
See application file for complete search history.

(56) References Cited

U.S. PATENT DOCUMENTS 6,232,211 B1 * 5/2001 Tsukahara ............... H01L 24/13
257/737
6,933,608 B2 8/2005 Fujisawa
(Continued)

FOREIGN PATENT DOCUMENTS

CN 101609825 A 12/2009
EP 0 355 955 A2 2/1990
(Continued)

OTHER PUBLICATIONS

Communication dated Jul. 24, 2022, issued by the Intellectual Property Office of Singapore in counterpart Singapore Application No. 10201905745X.
(Continued)

*Primary Examiner* — Vu A Vu
*Assistant Examiner* — Valerie N Newton
(74) *Attorney, Agent, or Firm* — Sughrue Mion, PLLC

(57) ABSTRACT

A bonding wire for connecting a first pad to a second pad is provided. The bonding wire includes a ball part bonded to the first pad, a neck part formed on the ball part, and a wire part extending from the neck part to the second pad. Less than an entire portion of a top surface of the neck part is covered by the wire part, and the wire part is in contact with the neck part, the ball part, and the first pad.

18 Claims, 12 Drawing Sheets

(51) Int. Cl.
  *H01L 23/48* (2006.01)
  *H01L 25/065* (2023.01)
(52) U.S. Cl.
  CPC .............. *H01L 24/09* (2013.01); *H01L 24/32* (2013.01); *H01L 24/73* (2013.01); *H01L 25/0657* (2013.01); *H01L 2224/73215* (2013.01)

(56) References Cited

U.S. PATENT DOCUMENTS

| | | | |
|---|---|---|---|
| 7,025,247 | B2 | 4/2006 | Mii et al. |
| 7,464,854 | B2 | 12/2008 | Babinetz |
| 8,237,295 | B2 | 8/2012 | Sano et al. |
| 8,609,527 | B2 | 12/2013 | Kurita |
| 8,815,732 | B2 | 8/2014 | Mii et al. |
| 2006/0163331 | A1 | 7/2006 | Babinetz |
| 2007/0108574 | A1 | 5/2007 | Kang et al. |
| 2007/0284416 | A1* | 12/2007 | Wong ................. H01L 24/48 228/101 |
| 2008/0099895 | A1 | 5/2008 | Kwak |
| 2009/0146321 | A1 | 6/2009 | Beaulieu et al. |
| 2011/0070729 | A1 | 3/2011 | Kurita |
| 2011/0136334 | A1* | 6/2011 | Ryu ................. H01L 24/48 438/612 |
| 2014/0021608 | A1* | 1/2014 | Choi ................. H01L 24/48 257/738 |
| 2014/0070235 | A1* | 3/2014 | Andrews ............. H01L 33/48 438/28 |
| 2015/0200181 | A1 | 7/2015 | Haga et al. |
| 2016/0379953 | A1* | 12/2016 | Thompson ........... H01L 24/48 257/737 |
| 2017/0179065 | A1* | 6/2017 | Koo ................. H01L 24/48 |
| 2018/0146557 | A1 | 5/2018 | Co et al. |

FOREIGN PATENT DOCUMENTS

| | | |
|---|---|---|
| JP | 9-51011 A | 2/1997 |
| JP | 2005-167178 A | 6/2005 |
| JP | 2011-54727 A | 3/2011 |
| KR | 10-2004-0086064 A | 10/2004 |
| KR | 10-2007-0088489 A | 8/2007 |

OTHER PUBLICATIONS

Communication dated Oct. 17, 2023 issued by the Korean Intellectual Property Office in counterpart Korean Application No. 10-2018-0116580.

Notice Of Allowance dated Jan. 1, 2025, issued by Chinese Patent Office in Chinese Patent Application No. 201910519663.7.

* cited by examiner

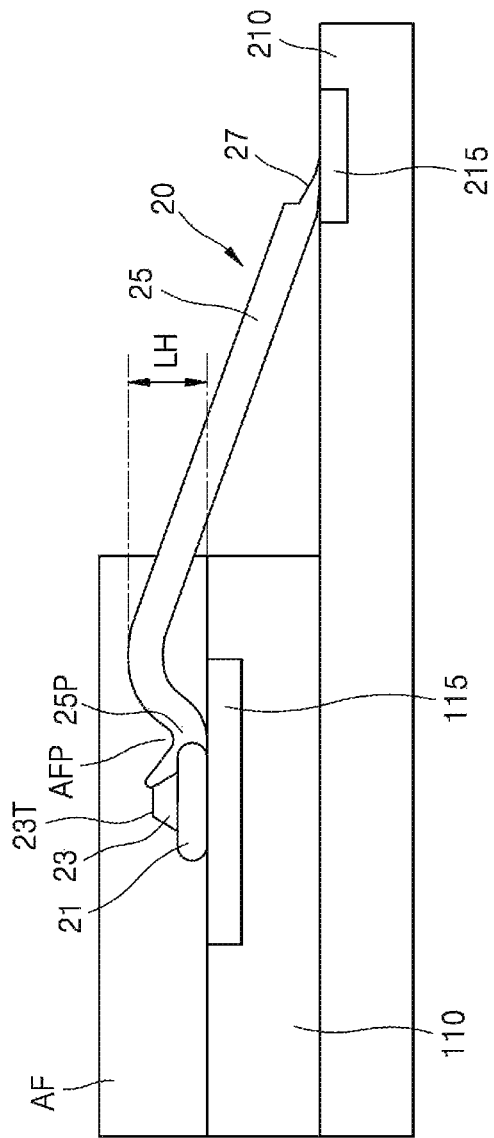

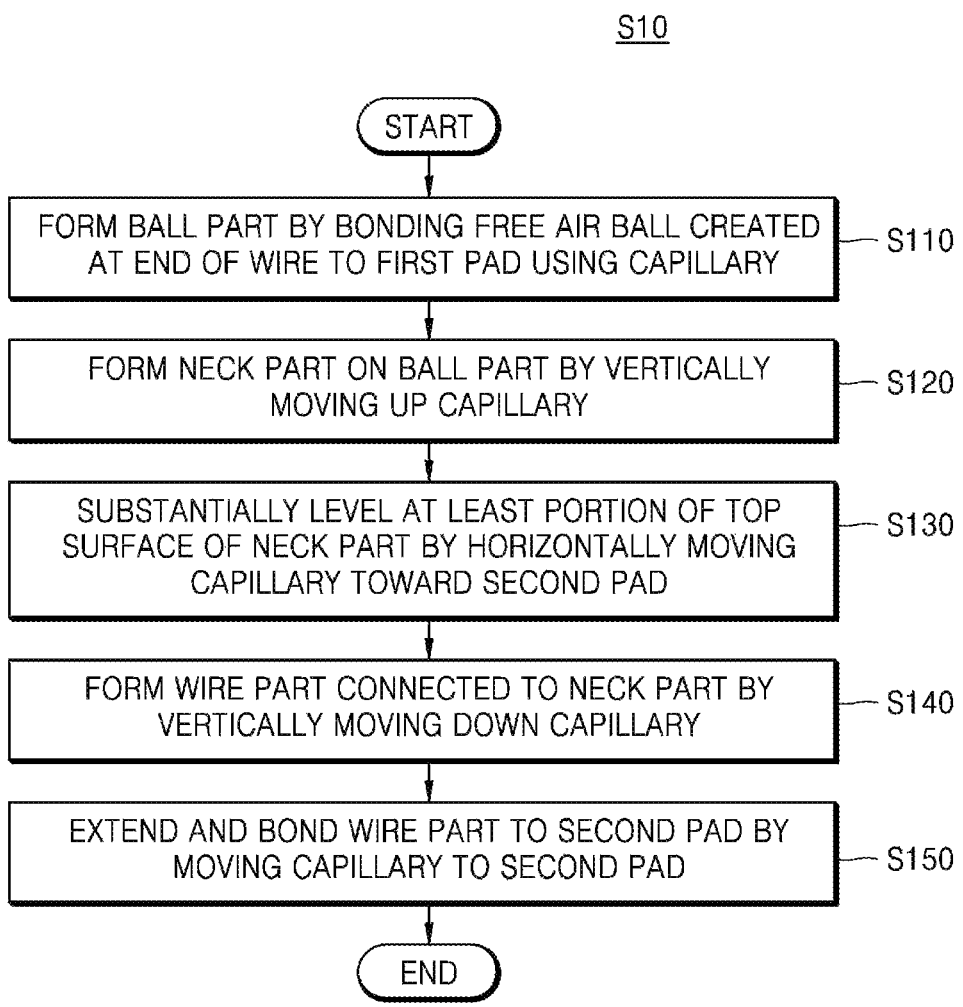

BONDING WIRE, SEMICONDUCTOR PACKAGE INCLUDING THE SAME, AND WIRE BONDING METHOD

CROSS-REFERENCE TO RELATED APPLICATION

This application is a Divisional of U.S. application Ser. No. 16/361,339 filed on Mar. 22, 2019, now U.S. Pat. No. 11,094,666, which claims priority from Korean Patent Application No. 10-2018-0116580 filed on Sep. 28, 2018, in the Korean Intellectual Property Office, the disclosures of which are incorporated by reference herein in their entireties.

BACKGROUND

Apparatuses and methods consistent with example embodiments relate to a bonding wire which decreases a loop height and has a strong connection structure, a semiconductor package including the same, and a wire bonding method.

Semiconductor packages may include an assembly board and a plurality of semiconductor chips stacked on the assembly board. The plurality of semiconductor chips may be stacked on the assembly board using an adhesive film. A bonding wire may be connected between two adjacent semiconductor chips that are stacked using the adhesive film. The bonding wire may have a loop height. As the size and thickness of semiconductor packages used in electronic devices have decreased, it is necessary to decrease the loop height of a bonding wire in the semiconductor packages.

SUMMARY

Various example embodiments provide a bonding wire for decreasing a loop height and securing the reliability of a connection structure and a semiconductor package including the same.

Various example embodiments also provide a wire bonding method by which the loop height of a bonding wire is decreased and the reliability of a connection structure is secured.

According to an aspect of an example embodiment, there is provided a bonding wire for connecting a first pad to a second pad. The bonding wire includes a ball part bonded to the first pad, a neck part formed on the ball part, and a wire part extending from the neck part to the second pad. Less than an entire portion of a top surface of the neck part is covered by the wire part, and the wire part is in contact with the neck part, the ball part, and the first pad.

According to an aspect of another example embodiment, there is provided a semiconductor package including a semiconductor chip having a first pad on a top surface thereof; an assembly board having a second pad on a top surface thereof, the semiconductor chip being mounted on the assembly board; and a bonding wire configured to connect the first pad to the second pad. The bonding wire includes a ball part bonded to the first pad; a neck part formed on the ball part; and a wire part extending from the neck part to the second pad, a portion of a top surface of the neck part is covered by the wire part, and the wire part is in contact with the neck part, the ball part, and the first pad.

According to an aspect of an example embodiment, there is provided a semiconductor package including a semiconductor chip having a first pad on a top surface thereof; an assembly board having a second pad on a top surface thereof, the semiconductor chip being mounted on the assembly board; a bonding wire configured to connect the first pad to the second pad; and an adhesive film disposed on a top surface of the semiconductor chip, the first pad, and a portion of the bonding wire. The bonding wire includes a ball part bonded to the first pad; a neck part formed on the ball part; a wire part extending from the neck part to the second pad; and a stitch part bonded to the second pad, and a top surface of the neck part is completely covered by the adhesive film, and the wire part is in contact with the neck part, the ball part, and the first pad.

According to an aspect of an example embodiment, there is provided a wire bonding method for connecting a first pad and a second pad. The wire bonding method includes forming a ball part by bonding a free air ball created at a first end of a wire to the first pad using a capillary; forming a neck part on the ball part by vertically moving the capillary away from the first pad; substantially leveling at least a portion of a top surface of the neck part by moving the capillary horizontally toward the second pad; forming a wire part by vertically moving the capillary toward the first pad, the wire part being connected to the neck part; and extending and bonding the wire part to the second pad by moving the capillary to the second pad. A pressed region of the wire part has a V-shape and is in contact with the neck part, the ball part, and the first pad.

BRIEF DESCRIPTION OF THE DRAWINGS

The above and other aspects, features and advantages will be more clearly understood from the following detailed description, taken in conjunction with the accompanying drawings, in which:

FIG. 2B is a cross-sectional view of a Region BB in FIG. 2A;

FIG. 3 is a flowchart of a wire bonding method according to an example embodiment;

DETAILED DESCRIPTION

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Figure 1A:
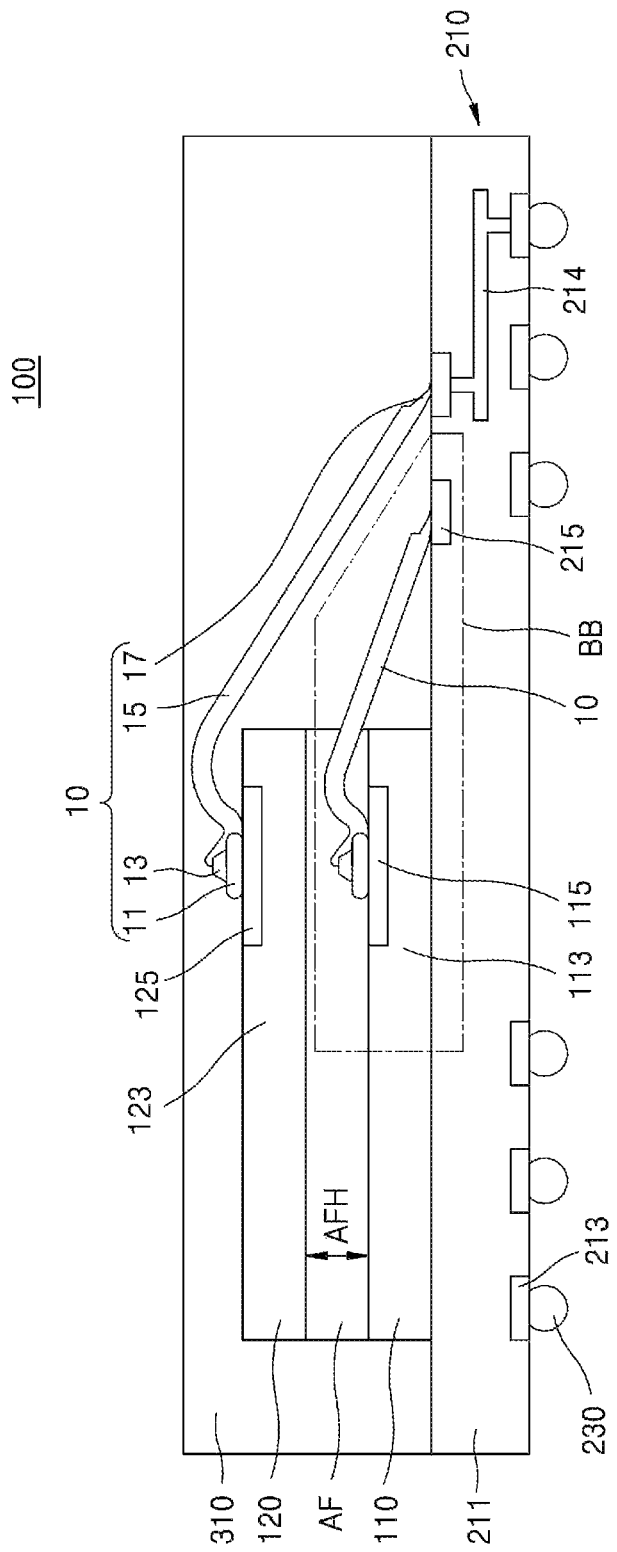
FIG. 1A is a cross-sectional view of a semiconductor package including a bonding wire, according to an example embodiment.
Figure 1B:
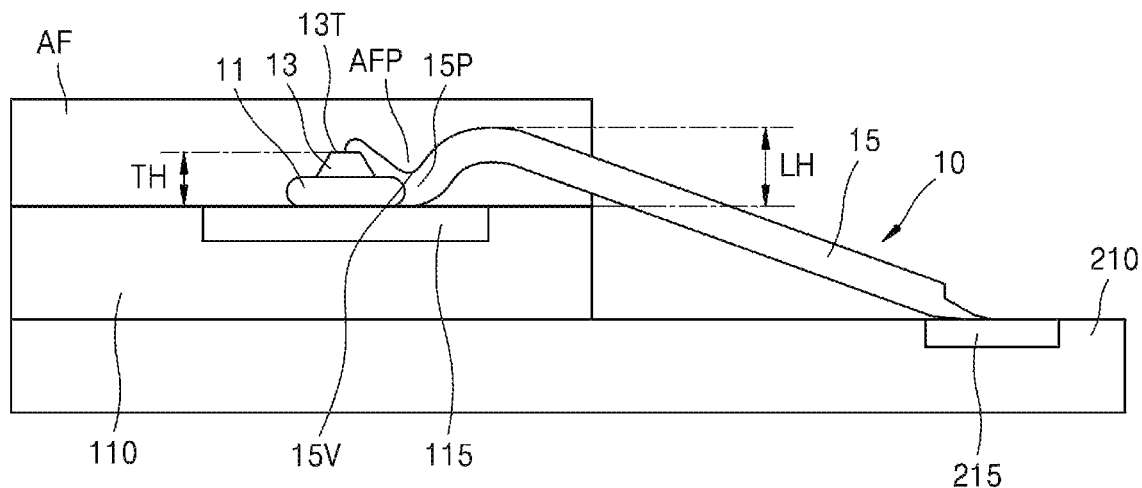
FIG. 1B is a cross-sectional view of a Region BB in FIG. 1A.
Figure 1C:
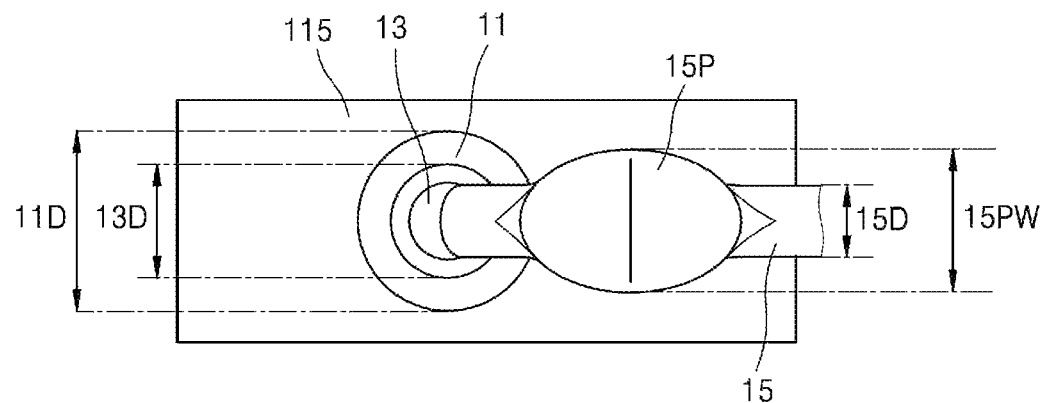
FIG. 1C is a plan view of a first pad portion.
Figure 1D:
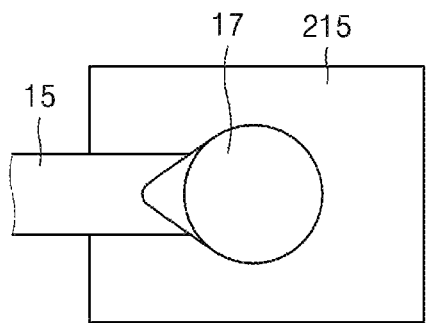
FIG. 1D is a plan view of a second pad portion.

FIG. 1A is a cross-sectional view of a semiconductor package including a bonding wire, according to an example embodiment. FIG. 1B is a cross-sectional view of a Region BB in FIG. 1A. FIG. 1C is a plan view of a first pad portion. FIG. 1D is a plan view of a second pad portion.

Referring to FIGS. 1A, 1B, 1C and 1D, a semiconductor package 100 may include a first semiconductor chip 110, a second semiconductor chip 120, an assembly board 210, a molding member 310, and a bonding wire 10.

The semiconductor package 100 may include the first and second semiconductor chips 110 and 120, which are vertically stacked on the assembly board 210.

The first and second semiconductor chips 110 and 120 may each be electrically connected to the assembly board 210 through the bonding wire 10. In addition, the first and second semiconductor chips 110 and 120 may be attached to each other by an adhesive film AF.

Each of the first and second semiconductor chips 110 and 120 may include a memory chip or a logic chip. For example, both of the first and second semiconductor chips 110 and 120 may include the same type of memory chip, or one of the first and second semiconductor chips 110 and 120 may include a memory chip and the other may include a logic chip.

The memory chip may include a volatile or nonvolatile memory chip. The volatile memory chip may include, for example, an existing volatile memory chip, such as dynamic random access memory (DRAM), static RAM (SRAM), or thyristor RAM (TRAM), or a volatile memory chip that is being developed. The nonvolatile memory chip may include, for example, an existing nonvolatile memory chip, such as flash memory, magnetic RAM (MRAM), spin-transfer torque MRAM (STT-MRAM), ferroelectric RAM (FRAM), phase change RAM (PRAM), or resistive RAM (RRAM), or a nonvolatile memory chip that is being developed.

The logic chip may be implemented as, for example, a microprocessor, a graphics processor, a signal processor, a network processor, a chipset, an audio codec, a video codec, an application processor, or a system on chip, but is not limited thereto.

Although the semiconductor package 100 in which the first and second semiconductor chips 110 and 120 are stacked is illustrated, the number of semiconductor chips stacked in the semiconductor package 100 is not limited to two. For example, one, three, four or more semiconductor chips may be stacked in the semiconductor package 100.

The first semiconductor chip 110 may include a first semiconductor substrate 113 and a chip pad 115. The chip pad 115 may be referred to as a first pad herein. The first semiconductor substrate 113 may have a top surface and a bottom surface which face each other. The first semiconductor substrate 113 may include a semiconductor device layer. The chip pad 115 may be formed on the semiconductor device layer. The chip pad 115 may include at least one material among aluminum (Al), copper (Cu), nickel (Ni), tungsten (W), platinum (Pt), and gold (Au).

The first semiconductor substrate 113 may include, for example, silicon. Alternatively, the first semiconductor substrate 113 may include a semiconductor element such as germanium or a compound semiconductor such as silicon carbide (SiC), gallium arsenide (GaAs), indium arsenide (InAs), or indium phosphide (InP). The first semiconductor substrate 113 may have a silicon-on-insulator (SOI) structure. For example, the first semiconductor substrate 113 may include a buried oxide (BOX) layer. The first semiconductor substrate 113 may include a conductive region, e.g., an impurity-doped well or an impurity-doped structure. The first semiconductor substrate 113 may have diverse isolation structures including a shallow trench isolation (STI) structure.

A passivation layer may be formed on the first semiconductor substrate 113 to protect the semiconductor device layer and other structures in the first semiconductor substrate 113 from external shock or moisture. The passivation layer may expose at least a portion of a top surface of the chip pad 115.

An adhesive film may be provided between a top surface of the assembly board 210 and a bottom surface of the first semiconductor chip 110 to attach the first semiconductor chip 110 to the assembly board 210.

The second semiconductor chip 120 may be mounted on a top surface of the first semiconductor chip 110. The adhesive film AF may be provided between the top surface of the first semiconductor chip 110 and a bottom surface of the second semiconductor chip 120 to attach the second semiconductor chip 120 to the first semiconductor chip 110.

The second semiconductor chip 120 may include a second semiconductor substrate 123 and a chip pad 125. The second semiconductor substrate 123 may have a top surface and a bottom surface which face each other. The second semiconductor substrate 123 may include a semiconductor device layer. The chip pad 125 may be formed on the semiconductor device layer.

The adhesive film AF may include, for example, a die attach film (DAF). The DAF may be classified into an inorganic adhesive or a polymer adhesive. The polymer adhesive may be classified into thermosetting resin and thermoplastic resin. The thermosetting resin has a three-dimensional cross-link structure after monomers are heated and is not softened when reheated. In contrast, the thermoplastic resin shows plasticity when heated and has a linear polymer structure. There is also a hybrid type produced by mixing these two types of resins.

The assembly board 210 is a supporting board and may include a body portion 211, a lower protective layer, and an upper protective layer. The assembly board 210 may be formed based on a printed circuit board (PCB), a wafer substrate, a ceramic substrate, a glass substrate, an interposer, or the like. In some example embodiments, the assembly board 210 may include a PCB. However, the assembly board 210 is not limited to a PCB.

An internal wiring 214 may be formed in the assembly board 210. The internal wiring 214 may be electrically connected to the first and second semiconductor chips 110 and 120 through the bonding wire 10 connected to an upper pad 215 in the top surface of the assembly board 210. The upper pad 215 may be referred to as a second pad herein.

In addition, an external connection terminal 230 may be located on a lower pad 213 in a bottom surface of the assembly board 210. The assembly board 210 may be electrically connected to and mounted on a module board or a system board of an electronic product through the external connection terminal 230. The external connection terminal 230 may include, for example, a pillar structure, a ball structure, or a solder layer.

The internal wiring 214 may be formed in multiple layers or a single layer in the body portion 211. The external connection terminal 230 may be electrically connected to the first and second semiconductor chips 110 and 120 through the internal wiring 214. The lower protective layer and the upper protective layer protect the body portion 211 and may include, for example, solder resist.

When the assembly board 210 is a PCB, the body portion 211 may be embodied by compressing a polymer material such as thermosetting resin, epoxy resin such as flame retardant 4 (FR-4), bismaleimide triazine (BT), or an Ajinomoto build-up film (ABF), or phenol resin to a certain thickness to form a thin profile, coating both surfaces of the thin profile with a copper foil, and forming the internal wiring 214, i.e., the transmission path of electrical signals, using patterning. The lower protective layer and the upper protective layer may be formed by applying solder resist to the entire bottom and top surfaces of the body portion 211 except for the lower pad 213 and the upper pad 215.

Meanwhile, PCBs may be classified into a single layer PCB having the internal wiring 214 only at one side or a double layer PCB having the internal wiring 214 at each of both sides. In addition, at least three layers of copper foil may be formed using an insulator called prepreg, and at least three internal wirings 214 may be formed according to the number of layers of copper foil, so that a multilayer PCB may be implemented. The assembly board 210 is not limited to the structures or materials of a PCB, which have been described above.

The molding member 310 may be formed to surround the first and second semiconductor chips 110 and 120 and the bonding wire 10.

The molding member 310 may include, for example, an epoxy molding compound. In some example embodiments, the molding member 310 is not limited to an epoxy molding compound and may include various materials, e.g., epoxy materials, thermosetting materials, thermoplastic materials, ultraviolet (UV) materials, etc. The thermosetting materials may include a phenol curing agent, an acid anhydride curing agent, an amine curing agent, and an acrylic polymer additive.

The molding member 310 is formed by injecting an appropriate amount of a molding material onto the assembly board 210 through an injection process, thereby forming the outer shape of the semiconductor package 100. When necessary, the outer shape of the semiconductor package 100 is formed by applying pressure to the molding material in a pressure process such as pressing. At this time, process conditions, such as delay time between the injection and the pressing of the molding material, the amount of the injected molding material, and pressing temperature/pressure, may be set taking into account a physical property, such as viscosity, of the molding material.

Side and top surfaces of the molding member 310 may be at right angles. A marking pattern, e.g., a barcode, a number, a character, or a symbol, which includes information of the first and second semiconductor chips 110 and 120, may be formed in a portion of the side surface of the molding member 310.

The molding member 310 may function to protect the first and second semiconductor chips 110 and 120 from external influences such as contamination and shock. For this function, the molding member 310 may have a thickness at least enough to completely surround the first and second semiconductor chips 110 and 120. The molding member 310 fully blankets the assembly board 210, and a width of the molding member 310 may be substantially the same as a width of the semiconductor package 100.

The bonding wire 10 may electrically connect each of the chip pads 115 and 125 to the upper pad 215.

At least one of a control signal for an operation of each of the first and second semiconductor chips 110 and 120, a power signal, and a ground signal may be received through the bonding wire 10. A data signal to be stored in each of the first and second semiconductor chips 110 and 120 may be received through the bonding wire 10. Data stored in the first and second semiconductor chips 110 and 120 may be output through the bonding wire 10.

Although the bonding wire 10 is arranged on only one surface of each of the first and second semiconductor chips 110 and 120 in the drawings, the arrangement of the bonding wire 10 is not limited thereto. For example, the bonding wire 10 may be arranged on each of at least two surfaces of each of the first and second semiconductor chips 110 and 120.

The bonding wire 10 may include at least one material among Au, silver (Ag), Cu, and Al. In some example embodiments, the bonding wire 10 may be connected using thermo-compression bonding, ultrasonic bonding, or thermosonic bonding, which is a combination of thermo-compression bonding and ultrasonic bonding.

For convenience's sake in the description, the bonding wire 10 connecting the chip pad 115 of the first semiconductor chip 110 to the upper pad 215 will be exemplarily described.

The bonding wire 10 may include a ball part 11, a neck part 13, a wire part 15, and a stitch part 17. In detail, the ball part 11 may be in direct contact with the top surface of the chip pad 115. The neck part 13 may be on a top surface of the ball part 11. The stitch part 17 may be in direct contact with a top surface of the upper pad 215. The wire part 15 may connect the neck part 13 and the stitch part 17 to each other. In other words, the bonding wire 10 may be bonded to the chip pad 115 using a ball bonding method and to the upper pad 215 using a stitch bonding method.

At least a portion of a top surface 13T of the neck part 13 of the bonding wire 10 may not to be covered with the wire part 15. The top surface 13T of the neck part 13 that is not covered with the wire part 15 may be substantially flat.

In some example embodiments, the wire part 15 of the bonding wire 10 may be in contact with the neck part 13, the ball part 11, and the chip pad 115. In detail, the wire part 15 may be in contact with top and side surfaces of the neck part 13, top and side surfaces of the ball part 11, and the top surface of the chip pad 115.

In some example embodiments, a pressed region 15P having a V-shape may be formed in the wire part 15 of the bonding wire 10 that is connected to the neck part 13. A sunken point in the pressed region 15P, i.e., a point at which a top surface of the wire part 15 is at the lowest level, may be in a region in which the wire part 15 is in contact with the top surface of the chip pad 115. The level of the sunken point in the pressed region 15P may be lower than the level of the top surface 13T of the neck part 13. In addition, a lowest bottom surface of the pressed region 15P may be in contact with the top surface of the chip pad 115 alongside a bottom surface of the ball part 11.

In some example embodiments, a portion of the bonding wire 10 may pass through the inside of the adhesive film AF. The adhesive film AF may have a protrusion region AFP having a V-shape in a portion corresponding to the pressed region 15P.

In the side cross-sectional view, a sum TH of a height of the ball part 11 and a height of the neck part 13 may be about 35 μm to about 40 μm. When the sum TH of the respective heights of the ball part 11 and the neck part 13 is less than 35 μm, the reliability of a strong connection structure may decrease. Contrarily, when the sum TH of the respective heights of the ball part 11 and the neck part 13 is greater than 40 μm, a thickness AFH of the adhesive film AF increases, and therefore, it may be hard to realize a small short lightweight semiconductor package.

As illustrated in FIG. 1C, a diameter 11D of the ball part 11 may be greater than a diameter 13D of the neck part 13. The diameter 13D of the neck part 13 may be less than a maximum width 15PW of the pressed region 15P. A diameter 15D of a normal region of the wire part 15 may be less than the maximum width 15PW of the pressed region 15P.

The bonding wire 10 may curve to form a loop shape. In this case, a loop height LH from the top surface of the chip pad 115 to the highest top surface of the bonding wire 10 may be greater than a sunken point 15V of the bonding wire at the pressed region 15P. In other words, the sunken point 15V of the bonding wire 10 may be relatively lower than the loop height LH. The adhesive film AF may be formed such that the thickness AFH of the adhesive film AF is greater than the loop height LH of the bonding wire 10, thereby preventing the bonding wire 10 from directly contacting the second semiconductor chip 120.

Because the pressed region 15P is formed by applying a mechanical force to the wire part 15, a cutting defect may occur in the pressed region 15P of the wire part 15.

According to example embodiments, the pressed region 15P having the V-shape is formed to be in contact with the neck part 13, the ball part 11, and the chip pad 115 in the bonding wire 10, so that the loop height LH of the bonding wire 10 may be decreased and the occurrence of a cutting defect in the pressed region 15P may also be decreased.

Therefore, in the semiconductor package 100 including the bonding wire 10 having the pressed region 15P, the thickness AFH of the adhesive film AF covering a portion of the bonding wire 10 may be decreased.

Consequently, the semiconductor package 100 including the bonding wire 10 may decrease the loop height LH of the bonding wire 10 and secure the reliability of a connection structure, so that the total thickness of the semiconductor package 100 may be decreased. As a result, the semiconductor package 100 may have a high degree of integration and a high capacity, and may be short, small and lightweight.

Figure 2A:
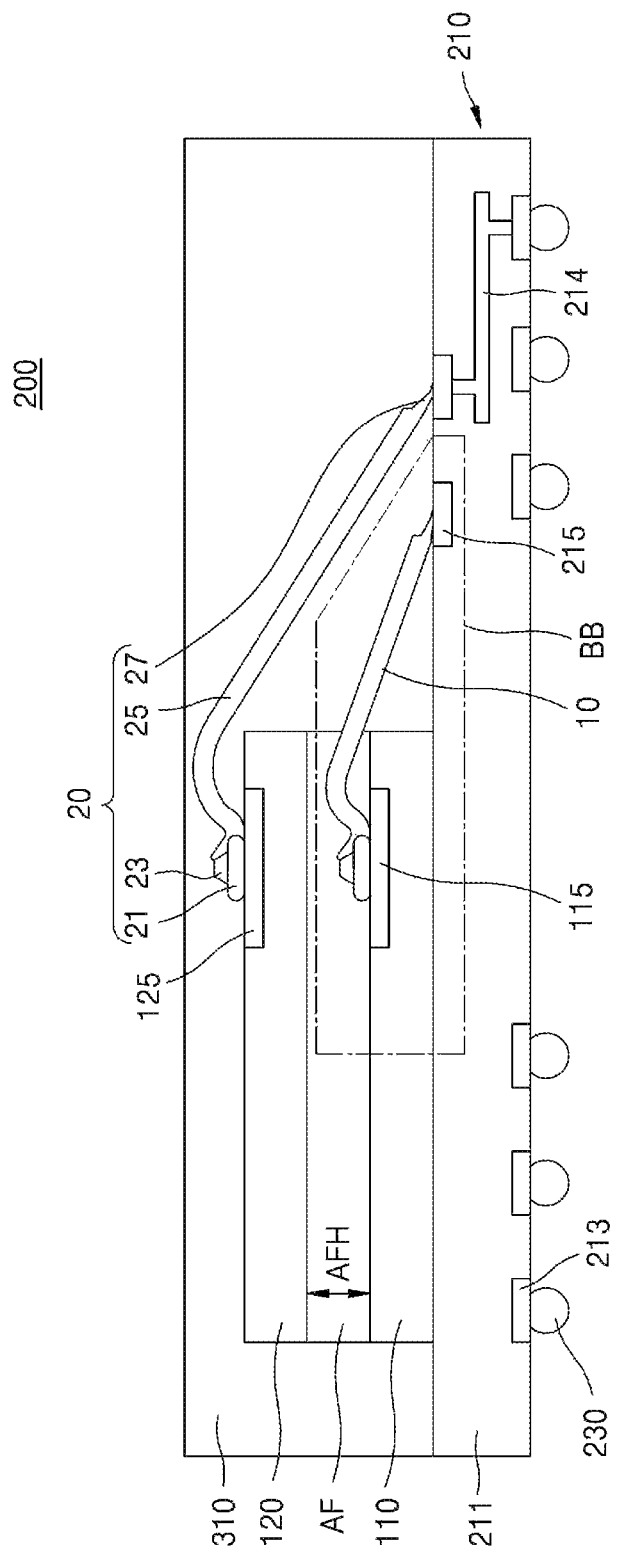
FIG. 2A is a cross-sectional view of a semiconductor package including a bonding wire, according to one or more example embodiments.

FIG. 2A is a cross-sectional view of a semiconductor package including a bonding wire 20, according to some example embodiments. FIG. 2B is a cross-sectional view of a Region BB in FIG. 2A.

Because elements of a bonding wire 20 and a semiconductor package 200 and a material included in each of the elements are the same as or similar to those described above with reference to FIGS. 1A, 1B, 1C and 1D, descriptions below will focus on differences.

Referring to FIGS. 2A and 2B, the semiconductor package 200 may include the first semiconductor chip 110, the second semiconductor chip 120, the assembly board 210, the molding member 310, and the bonding wire 20.

The bonding wire 20 may include a ball part 21, a neck part 23, a wire part 25, and a stitch part 27. In detail, the ball part 21 may be in direct contact with the top surface of the chip pad 115. The neck part 23 may be on a top surface of the ball part 21. The stitch part 27 may be in direct contact with a top surface of the upper pad 215. The wire part 25 may connect the neck part 23 and the stitch part 27 to each other. In other words, the bonding wire 20 may be bonded to the chip pad 115 using a ball bonding method and to the upper pad 215 using a stitch bonding method.

A top surface 23T of the neck part 23 of the bonding wire 20 may not be covered with the wire part 25. In other words, the entire top surface 23T of the neck part 23 may be completely covered with the adhesive film AF. The top surface 23T of the neck part 23 that is not completely covered with the wire part 25 may be substantially flat.

In some example embodiments, the wire part 25 of the bonding wire 20 may be in contact with the neck part 23, the ball part 21, and the chip pad 115. In detail, the wire part 25 of the bonding wire 20 may be in contact with a side surface of the neck part 23, top and side surfaces of the ball part 21, and the top surface of the chip pad 115.

FIG. 3 is a flowchart of a wire bonding method according to an example embodiment.

The wire bonding method may include processes described below. The order of processes may be different from the order in which the processes are described. For instance, two processes sequentially described may be substantially performed simultaneously or in reverse order.

Referring to FIG. 3, a wire bonding method S10 may include forming a ball part by bonding a free air ball created at an end of a wire to a first pad using a capillary in operation S110, forming a neck part on the ball part by vertically moving up the capillary in operation S120, substantially leveling at least a portion of a top surface of the neck part by horizontally moving the capillary toward a second pad in operation S130, forming a wire part connected to the neck part by vertically moving down the capillary in operation S140, and extending and bonding the wire part to the second pad by moving the capillary to the second pad in operation S150.

In the wire bonding method S10, a V-shaped pressed region is formed to enable the wire part to be in contact with the neck part, the ball part, and the first pad, so that a loop height of a bonding wire formed on the first pad may be decreased and a cutting defect may also be decreased in the neck part and the wire part. At this time, the capillary may move from the first pad toward the second pad but not in a reverse direction.

FIGS. 4A, 4B, 4C, 4D, 4E, 4F, 4G and 4H are cross-sectional views of stages in a wire bonding method, according to an example embodiment.

Figure 4A:
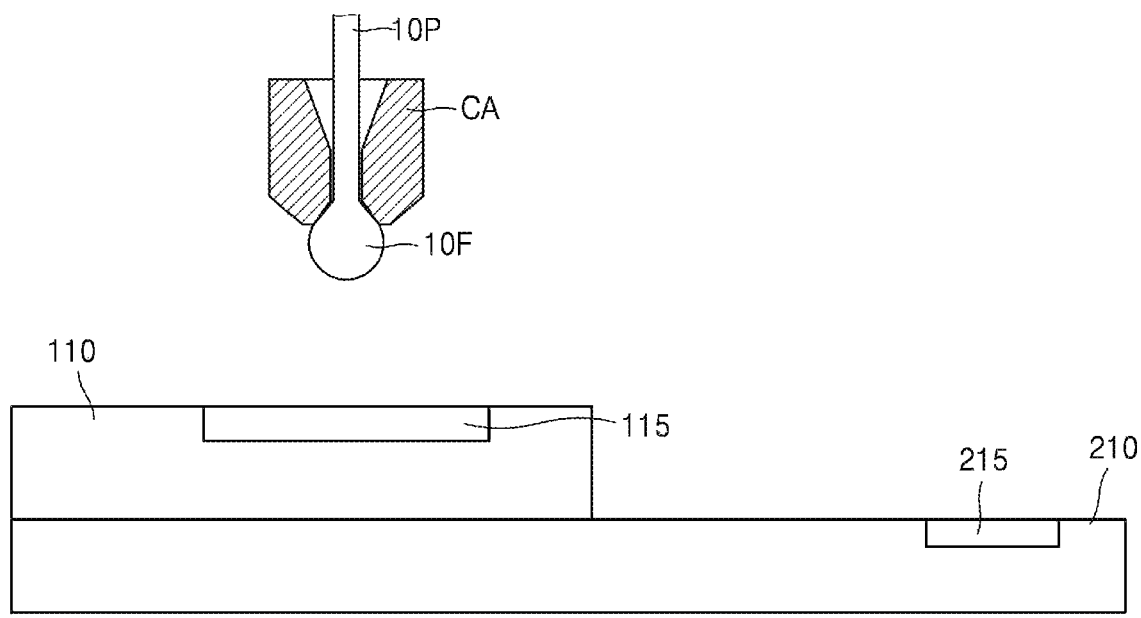
FIGS. 4A, 4B, 4C, 4D, 4E, 4F, 4G and 4H are cross-sectional views of stages in a wire bonding method, according to an example embodiment.

Referring to FIG. 4A, the first semiconductor chip 110 may include the chip pad 115. The assembly board 210 may include the upper pad 215. Hereinafter, the chip pad 115 and the upper pad 215 are called a first pad and a second pad, respectively.

The first semiconductor chip 110 may be arranged on the assembly board 210 such that the second pad 215 is not covered. An adhesive film may be provided between the top surface of the assembly board 210 and the bottom surface of the first semiconductor chip 110 to attach the first semiconductor chip 110 to the assembly board 210.

A capillary CA may be arranged at a first bonding position, e.g., above the first pad 115. In some example embodiments, the capillary CA may be located at a level corresponding to a certain height, e.g., an electronic flame-off height, above the first pad 115.

A portion of a reserve wire 10P may protrude from a central hole of the capillary CA. The reserve wire 10P may include at least one material among Au, Ag, Cu, and Al. An electric spark may be provided to the reserve wire 10P protruding from the central hole of the capillary CA such that a lower end of the reserve wire 10P may be melted. Accordingly, a free air ball 10F may be formed at the lower end of the reserve wire 10P in the central hole of the capillary CA. In some example embodiments, instead of an electric spark, ultrasonic energy or thermal energy may be provided to the lower end of the reserve wire 10P.

Movement of the reserve wire 10P may be limited in the capillary CA by closing a clamp.

Figure 4B:
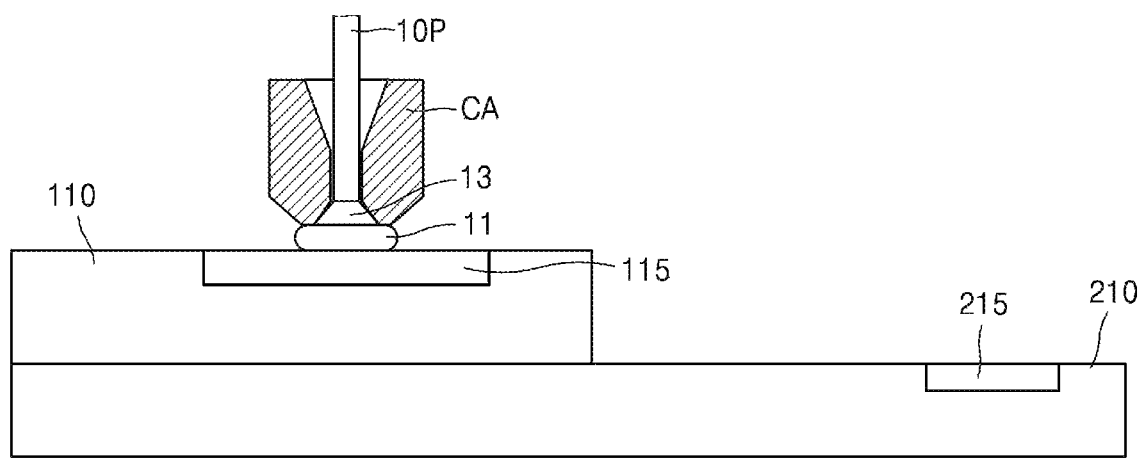

Referring to FIG. 4B, the capillary CA may be moved toward the first pad 115 such that the free air ball 10F (see FIG. 4A) may contact the first pad 115.

The free air ball 10F may be pressed between the capillary CA and the first pad 115 such that the ball part 11 and the neck part 13 may be formed at the lower end of the reserve wire 10P. Thermal energy and/or ultrasonic energy may be provided to the first semiconductor chip 110 such that the ball part 11 may be bonded to the first pad 115. Consequently, a ball bonding method, by which the ball part 11 is bonded to the first pad 115, may be implemented.

The neck part 13 may be shaped according to a chamfer angle inside the capillary CA. A diameter of the neck part 13 may be less than a diameter of the ball part 11. Accordingly, the neck part 13 may be fully seated on the top surface of the ball part 11.

Figure 4C:
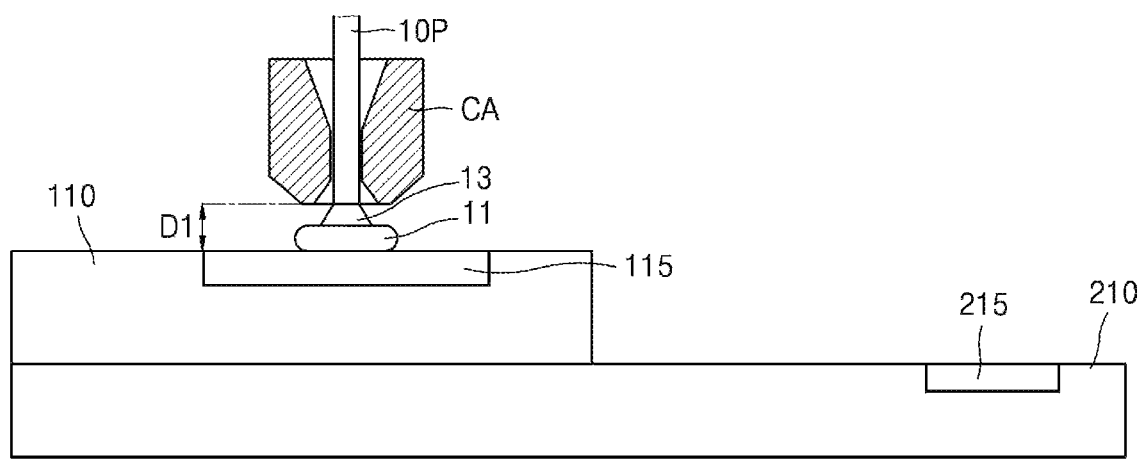

Referring to FIG. 4C, the capillary CA may be moved up perpendicular to the top surface of the first pad 115 such that the neck part 13 may be exposed outside the capillary CA.

The capillary CA may be vertically moved up to a height corresponding to a first distance D1 from the first pad 115. The first distance D1 may be about 35 μm to about 40 μm.

In some example embodiments, the capillary CA may be vertically moved until the top surface of the neck part 13 is at the same level as a bottom surface of the capillary CA.

Figure 4D:
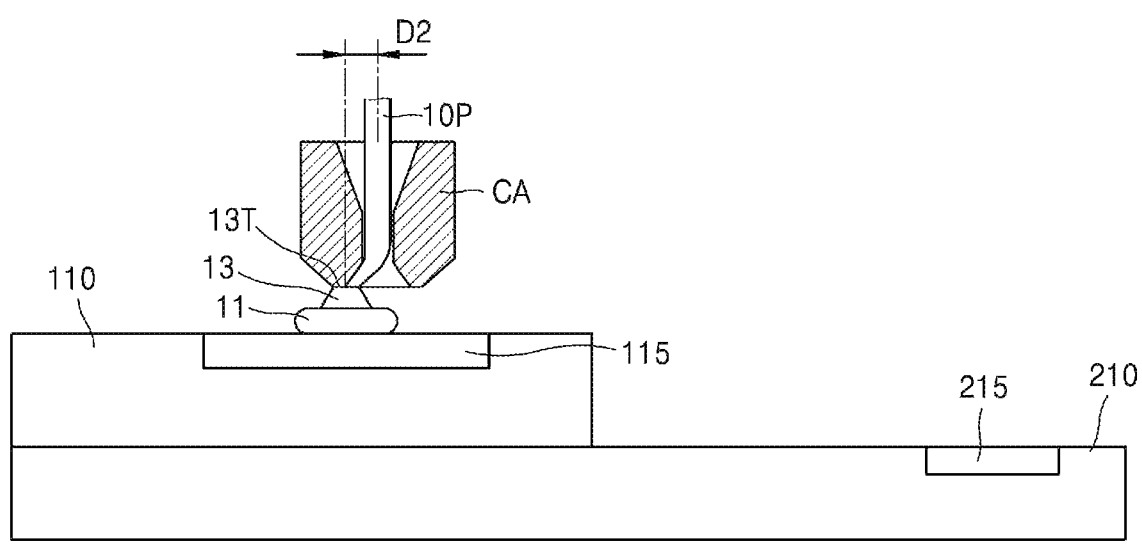

Referring to FIG. 4D, the capillary CA may be moved in parallel with the top surface of the first pad 115 toward the second pad 215 such that a portion of the top surface 13T of the neck part 13 may be exposed.

The capillary CA may be horizontally moved toward the second pad 215 by a second distance D2 from the center of the neck part 13. The second distance D2 may be about 35 μm to about 45 μm but is not limited thereto.

In some example embodiments, the capillary CA may be horizontally moved in a state where the top surface 13T of the neck part 13 is at the same level as the bottom surface of the capillary CA. In this case, the top surface 13T of the neck part 13 may be in partial contact with the reserve wire 10P. In other words, the bottom surface of the capillary CA may push a portion of the reserve wire 10P, which contacts the top surface 13T of the neck part 13, toward the second pad 215, so that the portion of the top surface 13T of the neck part 13 may be exposed.

Figure 4E:
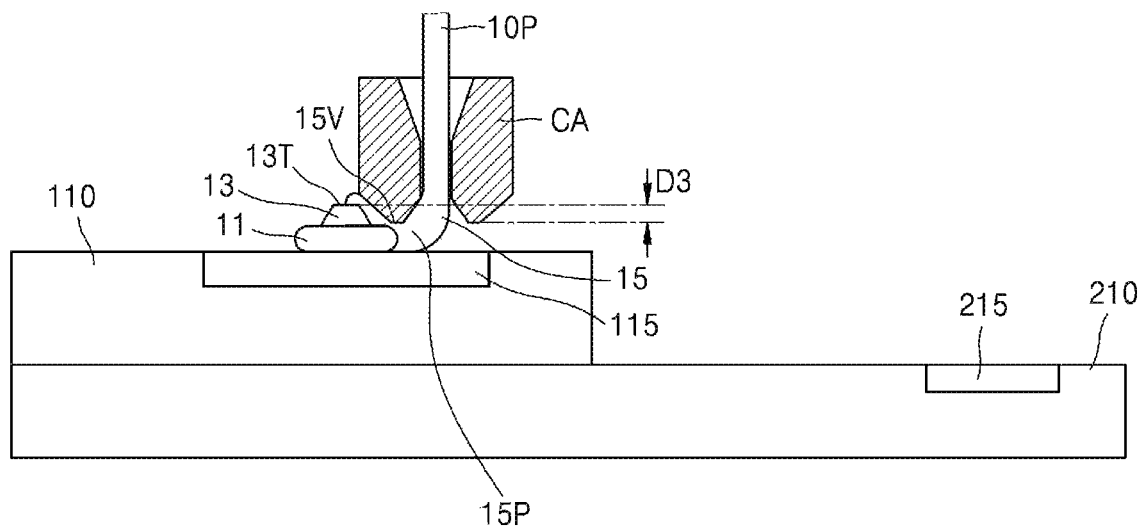

Referring to FIG. 4E, the capillary CA may be moved down perpendicular to the top surface of the first pad 115 such that the bottom surface of the capillary CA may press down the wire part 15, thereby forming the pressed region 15P having a V-shape in the wire part 15 that is connected to the neck part 13.

The pressed region 15P may be formed by applying a mechanical force to the wire part 15 using the capillary CA. The capillary CA may be moved down perpendicular to the top surface of the first pad 115 by a third distance D3 from the top surface 13T of the neck part 13. The third distance D3 may be about 20 μm to about 30 μm but is not limited thereto.

The capillary CA may be horizontally moved such that the central hole of the capillary CA may be positioned above the first pad 115 that is not occupied by the ball part 11 and then moved down perpendicular to the top surface of the first pad 115. The wire part 15 may be pressed down by the bottom surface of the capillary CA such that the pressed region 15P, which has a V-shape and a maximum width greater than a diameter of the neck part 13, may be formed in the wire part 15 having a cylindrical shape.

In some example embodiments, the pressed region 15P may be formed using the capillary CA such that the wire part 15 may be in contact with the neck part 13, the ball part 11, and the first pad 115. In detail, the wire part 15 may be in contact with the top and side surfaces of the neck part 13, the top and side surfaces of the ball part 11, and the top surface of the first pad 115.

In some example embodiments, a sunken point 15V in the pressed region 15P may be in a region in which the wire part 15 is in contact with the top surface of the first pad 115. In addition, the level of the sunken point 15V in the pressed region 15P may be lower than the level of the top surface 13T of the neck part 13.

Figure 4F:
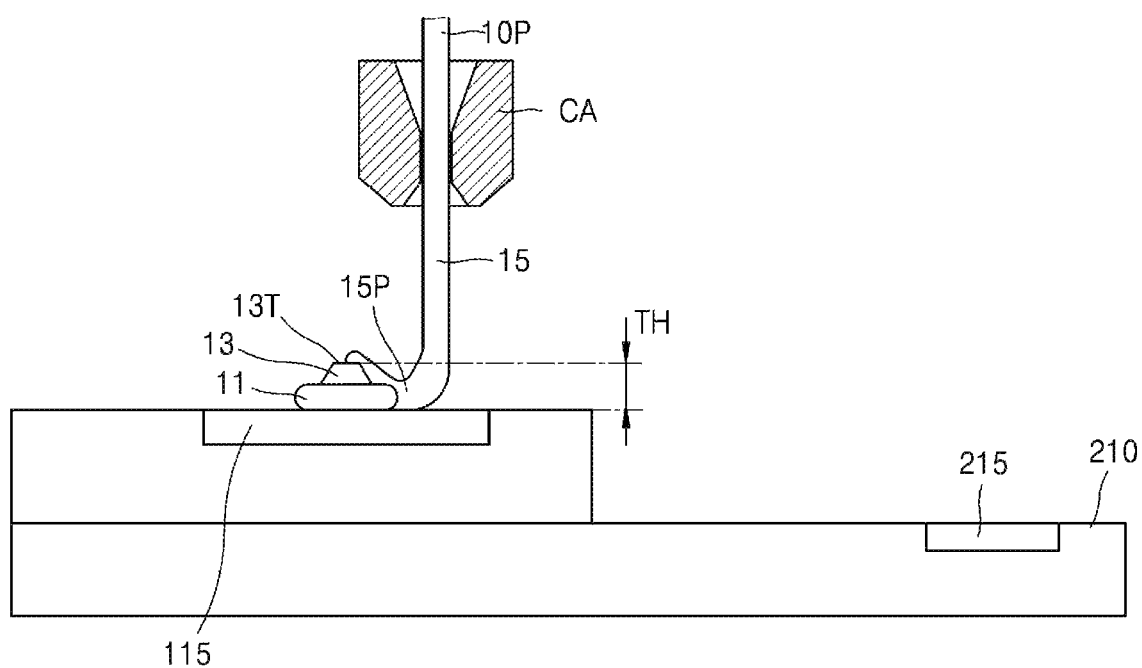

Referring to FIG. 4F, the capillary CA may be moved up perpendicular to the top surface of the first pad 115.

In the side cross-sectional view, the sum TH of the respective heights of the ball part 11 and the neck part 13 may be about 35 μm to about 40 μm. This is because the reliability of a strong connection structure may decrease when the sum TH of the respective heights of the ball part 11 and the neck part 13 is less than 35 μm, and a thickness of the adhesive film may increase in subsequent processes, and therefore, it may be hard to realize a small short lightweight semiconductor package, when the sum TH of the respective heights of the ball part 11 and the neck part 13 is greater than 40 μm.

The clamp may be opened to allow reserve wire 10P to form the wire part 15 that extends vertically from the top surface of the first pad 115.

Figure 4G:
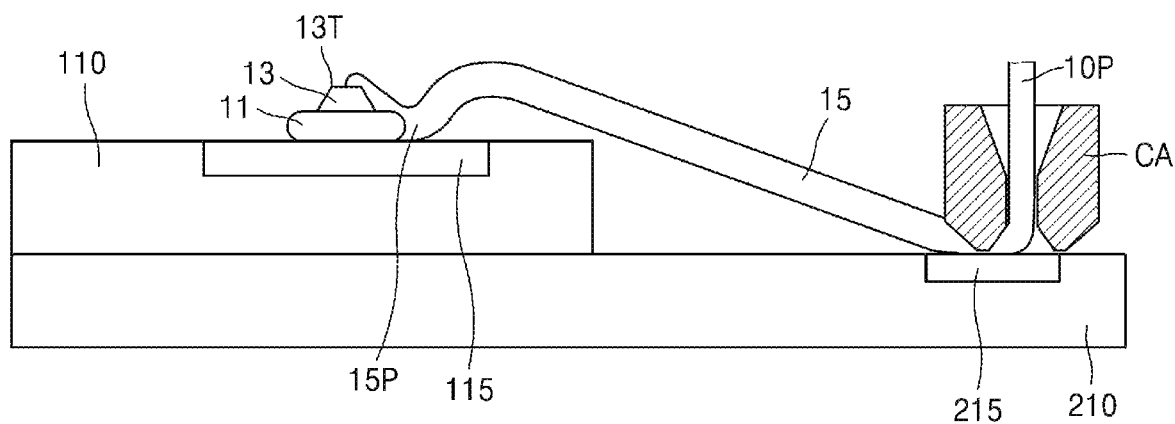

Referring to FIG. 4G, the capillary CA that has been vertically moved up from the first pad 115 may be horizontally moved toward a second bonding position, e.g., the second pad 215.

When the capillary CA moves with the clamp open, the wire part 15 discharged from the lower end of the capillary CA may be extended along the sliding of the capillary CA.

Through this operation, a wire loop may be formed between the first pad 115 and the second pad 215. The wire part 15 may form the wire loop and move along the curvature path of the capillary CA without a break.

Figure 4H:
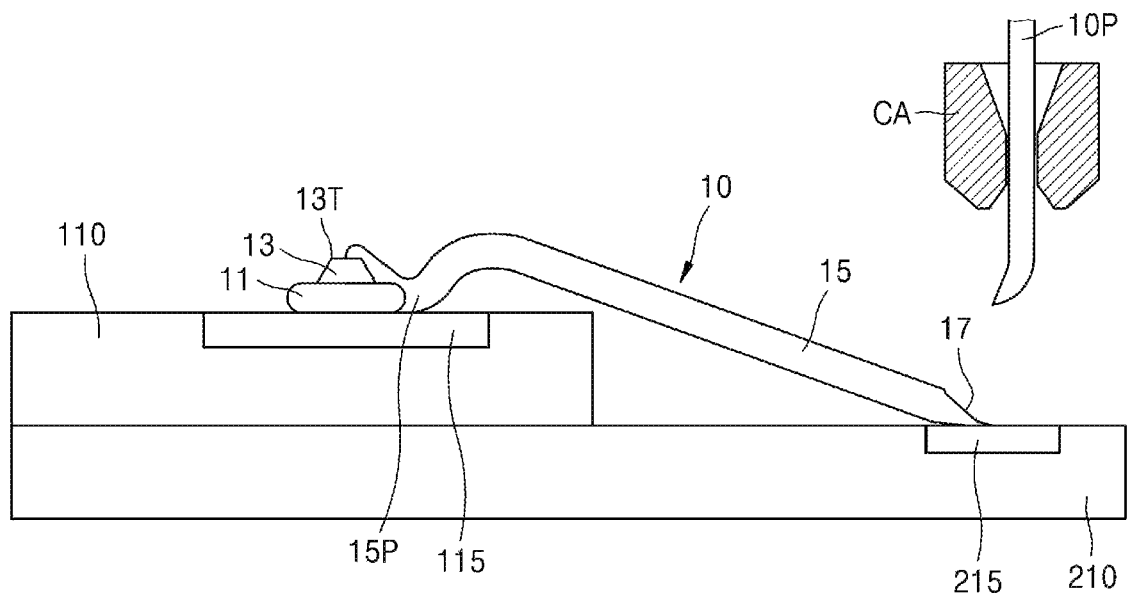

Referring to FIG. 4H, when the capillary CA is vertically moved up from the top surface of the second pad 215 in a state where the clamp is closed, the reserve wire 10P may be cut off from the stitch part 17. As a result, the bonding wire 10 that electrically connects the first pad 115 and the second pad 215 to each other may be formed.

Due to the upward movement of the capillary CA, the stitch part 17 may be formed in a portion in which the reserve wire 10P is bonded to the second pad 215. In other words, a stitch bonding method, by which the stitch part 17 that is a part of the bonding wire 10 is bonded to the second pad 215, may be implemented.

In some example embodiments, thermal energy or ultrasonic energy may be applied to the reserve wire 10P when the reserve wire 10P is cut off from the stitch part 17.

The capillary CA may be moved up to the level corresponding to the electronic frame-off height. Thereafter, the capillary CA may perform a new wire bonding process or be on standby. For example, the capillary CA may repeat the stages shown in FIGS. 4A, 4B, 4C, 4D, 4E, 4F, 4G and 4H, thereby forming a plurality of bonding wires 10.

Consequently, the wire bonding method may decrease the loop height of the bonding wire 10 and improve the reliability of a strong connection structure. Accordingly, the total thickness of the semiconductor package 100 (see FIG. 1A) including the bonding wire 10 may be decreased, to form the semiconductor package 100 that is short, small, and lightweight and has a high degree of integration and a high capacity.

Figure 5:
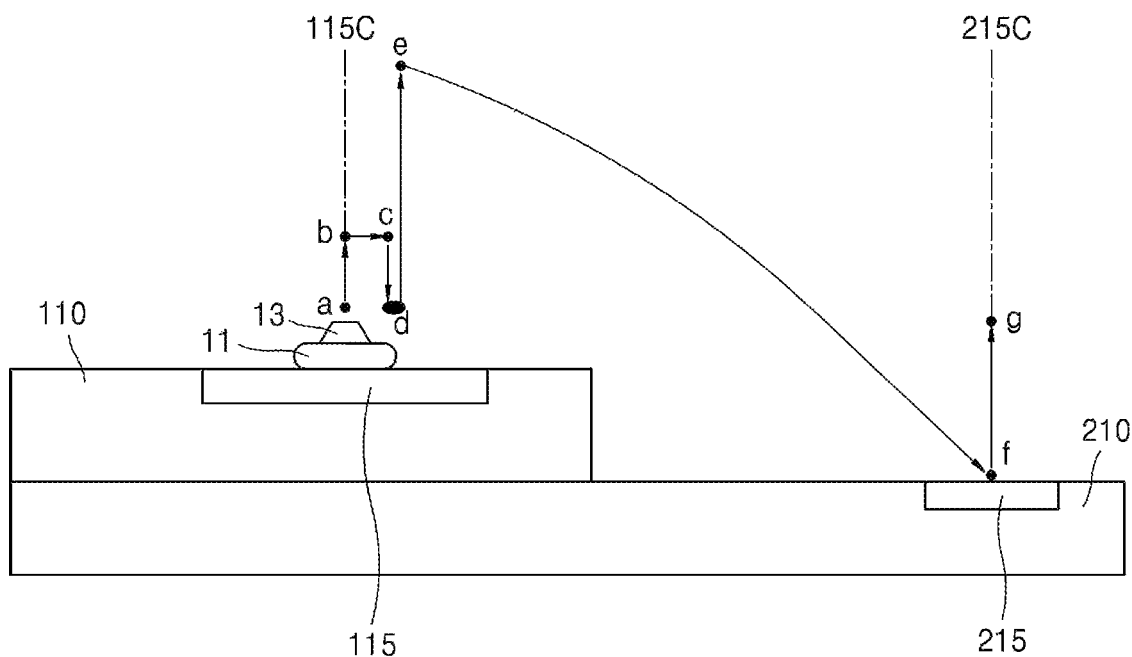
FIG. 5 is a schematic diagram showing a moving direction of a capillary in a wire bonding method, according to an example embodiment.

FIG. 5 is a schematic diagram showing a moving direction of a capillary in a wire bonding method, according to an example embodiment.

Referring to FIG. 5, a bonding wire may be formed by a continuous movement of a capillary from a point "a" to a point "b" to a point "c" to a point "d" to a point "e" to a point "e" to a point "f" to a point "g".

After a free air ball is formed at an end of a reserve wire, the capillary may press down the free air ball to a center of the first pad 115 using a ball bonding method. A position of the capillary when the ball part 11 and the neck part 13 are completely formed using the ball bonding method is marked with the point "a", and a moving path of the capillary is represented with the points "a," "b," "c," "d," "e," "f" and "g."

In a first movement from the point "a" to the point "b", the ball part 11 and the neck part 13 may be formed on the top surface of the first pad 115. The first movement may refer to a movement of the capillary traveling up perpendicular to the top surface of the first pad 115 and may correspond to the description made above with reference to FIG. 4C.

In a second movement from the point "b" to the point "c", a portion of the top surface of the neck part 13 may be formed substantially flat and exposed. The second movement may refer to a movement of the capillary traveling toward the second pad 215 in parallel with the top surface of the first pad 115 and may correspond to the description made above with reference to FIG. 4D.

In a third movement from the point "c" to the point "d", a wire part may be pressed down with the capillary such that a V-shaped pressed region may be formed in the wire part connected to the neck part 13. The third movement may refer to a movement of the capillary traveling down perpendicular to the top surface of the first pad 115 and may correspond to the description made above with reference to FIG. 4E.

In a fourth movement from the point "d" to the point "e", the wire part may be elongated. The fourth movement may refer to a movement of the capillary traveling up perpendicular to the top surface of the first pad 115 and may correspond to the description made above with reference to FIG. 4F.

In a fifth movement from the point "e" to the point "f", the wire part may slide toward the second pad 215 along the curvature path of the capillary and land on the second pad 215. The fifth movement may refer to a movement of the capillary traveling along the curvature path from the top surface of the first pad 115 to a center of the second pad 215 and may correspond to the description made above with reference to FIG. 4G.

In a sixth movement from the point "f" to the point "g", the reserve wire is cut off forming a stitch part, so that a bonding wire electrically connecting the first pad 115 and the second pad 215 to each other may be formed. The sixth movement may refer to a movement of the capillary traveling up perpendicular to the top surface of the second pad 215 and may correspond to the description made above with reference to FIG. 4H.

In a wire bonding method according to example embodiments, the continuous first through sixth movements of the capillary from the point "a" to the point "b" to the point "c" to the point "d" to the point "e" to the point "e" to the point "f" to the point "g" may progress in a direction from the first pad 115 toward the second pad 215 but not in a reverse direction.

Consequently, because the capillary moves only forward horizontally from the center of the first pad 115 to the center of the second pad 215 but not in the reverse direction, the product and process efficiencies of a bonding wire may be increased.

Figure 6A:
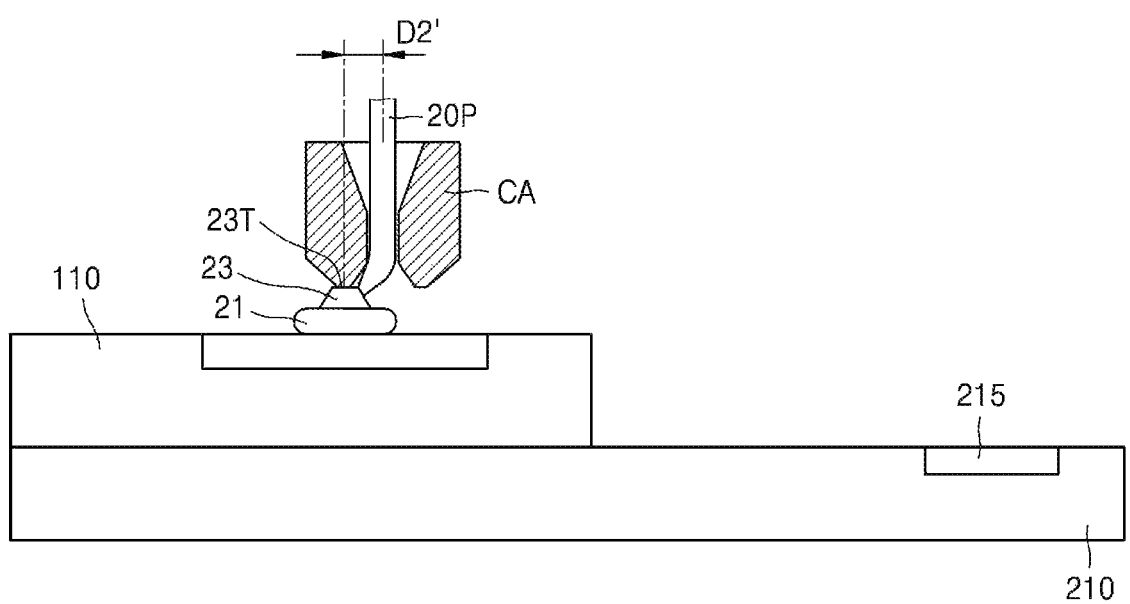
FIGS. 6A and 6B are cross-sectional views of some stages in a wire bonding method, according to one or more example embodiments.
Figure 6B:
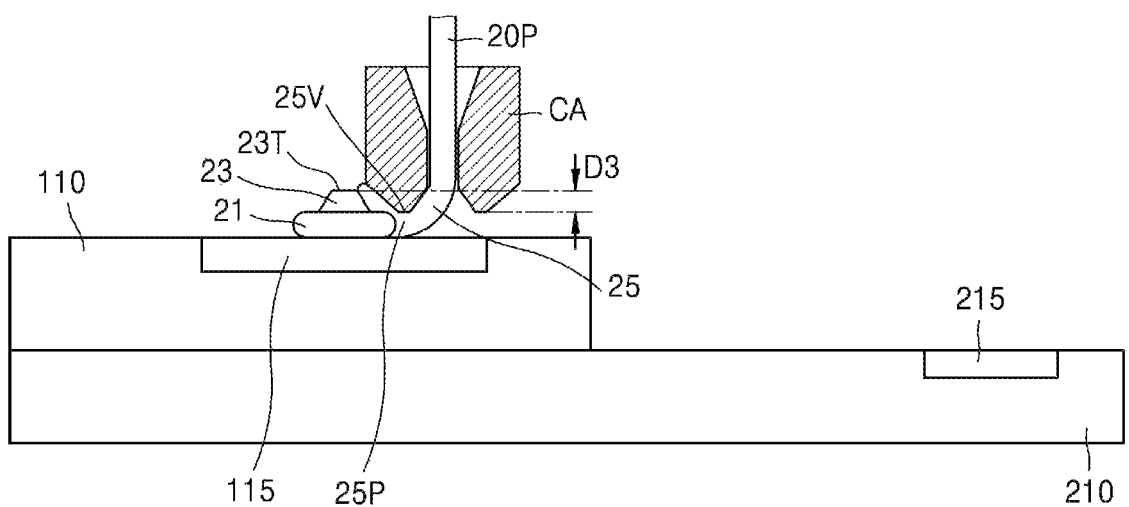

FIGS. 6A and 6B are cross-sectional views of some stages in a wire bonding method, according to some example embodiments.

In detail, an example of a method of manufacturing the bonding wire 20 according to the example embodiment described above with reference to FIGS. 2A and 2B will be described.

FIG. 6A corresponds to the stage described above with reference to FIG. 4D. FIG. 6B corresponds to the stage described above with reference to FIG. 4E. The method of manufacturing the bonding wire 20 is the same as or similar to the wire bonding method described above with reference to FIGS. 4A, 4B, 4C, 4D, 4E, 4F, 4G and 4H, the description below will focus on the differences between the methods.

Referring to FIG. 6A, the capillary CA may be moved in parallel with the top surface of the first pad 115 toward the second pad 215 such that the top surface 23T of the neck part 23 may be entirely exposed, not covered by a reserve wire 20P.

The capillary CA may be horizontally moved toward the second pad 215 by a second distance D2' from the center of the neck part 23. The second distance D2' may be greater than the second distance D2 described above with reference to FIG. 4D. The second distance D2' may be about 35 μm to about 45 μm but is not limited thereto.

In some example embodiments, the capillary CA may be horizontally moved in a state where the top surface 23T of the neck part 23 is at the same level as the bottom surface of the capillary CA.

In this case, the top surface 23T of the neck part 23 may not be in contact with the reserve wire 20P, but the side surface of the neck part 23 may be in contact with the reserve wire 20P. In other words, the bottom surface of the capillary CA may push all of the reserve wire 20P, which contacts the top surface 23T of the neck part 23, toward the second pad 215 so that all of the top surface 23T of the neck part 23 may be exposed.

Referring to FIG. 6B, the capillary CA may be moved down perpendicular to the top surface of the first pad 115 such that the capillary CA may press down the wire part 25, thereby forming the pressed region 25P having a V-shape in the wire part 25 that is connected to the neck part 23.

The pressed region 25P may be formed by applying a mechanical force to the wire part 25 using the capillary CA. The capillary CA may be moved down perpendicular to the top surface of the first pad 115 by the third distance D3 from the top surface 23T of the neck part 23. The third distance D3 may be about 20 μm to about 30 μm but is not limited thereto.

In some example embodiments, the pressed region 25P may be formed using the capillary CA such that the wire part 25 may be in contact with the neck part 23, the ball part 21, and the first pad 115. In detail, the wire part 25 may be in contact with the side surface of the neck part 23, the top and side surfaces of the ball part 21, and the top surface of the first pad 115.

In some example embodiments, a sunken point 25V of the pressed region 25P may be in a region in which the wire part 25 is in contact with the top surface of the first pad 115. In addition, the level of the sunken point 25V of the pressed region 25P may be lower than the level of the top surface 23T of the neck part 23.

Consequently, according to the current example embodiments, the wire bonding method may decrease the loop height of the bonding wire 20 and secure the reliability of a strong connection structure. Accordingly, the total thickness of the semiconductor package 200 (see FIG. 2A) including the bonding wire 20 may be decreased, so that the semiconductor package 200 that is short, small and lightweight, and has a high degree of integration and a high capacity may be realized.

Figure 7:
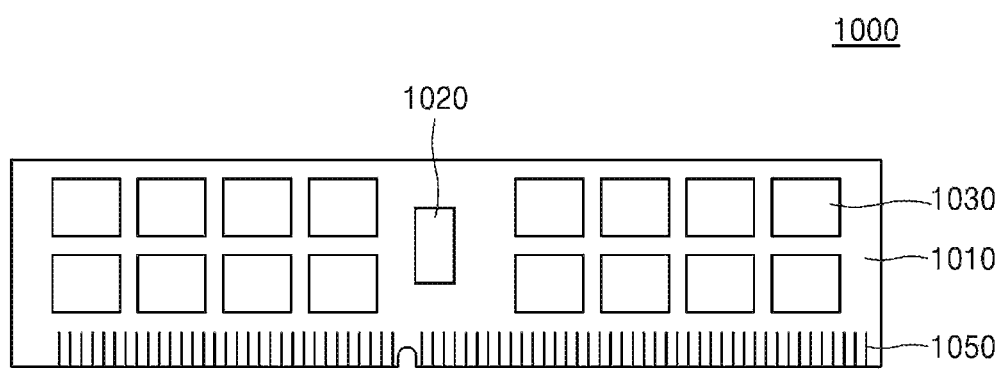
FIG. 7 is a plan view of a semiconductor module including a semiconductor package, according to an example embodiment.

FIG. 7 is a plan view of a semiconductor module including a semiconductor package, according to an example embodiment.

Referring to FIG. 7, a semiconductor module 1000 may include a module board 1010, a control chip 1020 mounted on the module board 1010, and a plurality of semiconductor packages 1030 mounted on the module board 1010.

A plurality of input/output terminals 1050, which may be inserted into a socket of a main board, may be arranged at a side of the module board 1010. At least one of the semiconductor packages 1030 may include any of the semiconductor packages 100 and 200 described with reference to FIGS. 1A, 1B, 1C, 1D, 2A and 2B.

Figure 8:
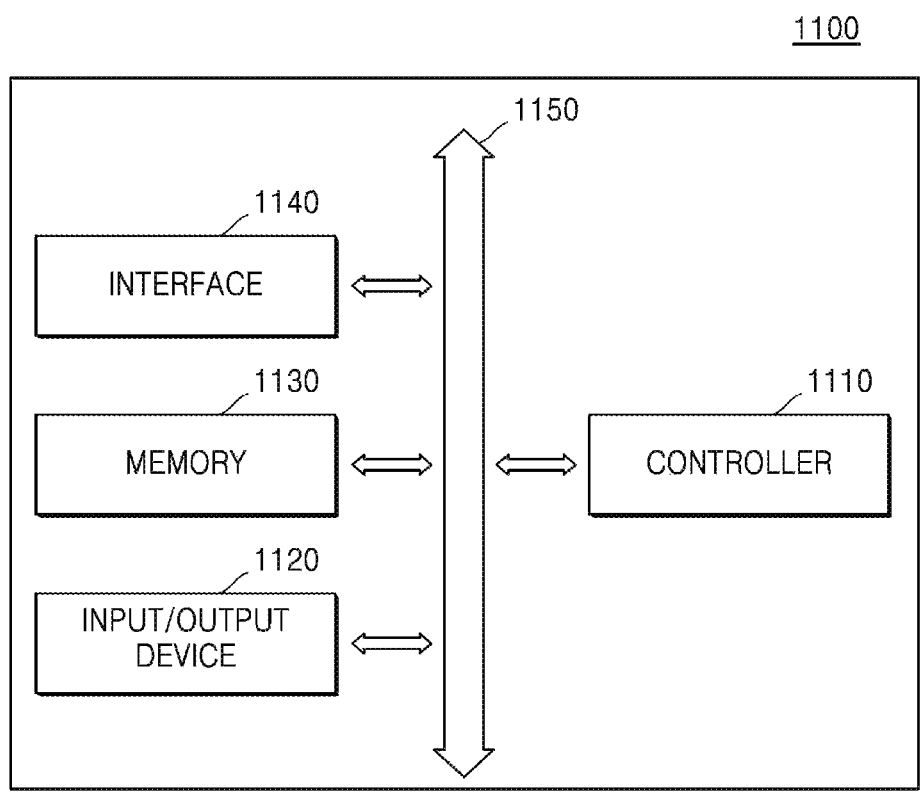
FIG. 8 is a block diagram of a system of a semiconductor package, according to an example embodiment.

FIG. 8 is a block diagram of a system of a semiconductor package, according to an example embodiment.

Referring to FIG. 8, a system 1100 may include a controller 1110, an input/output device 1120, a memory 1130, an interface 1140, and a bus 1150.

The system 1100 may transmit or receive information. The system 1100 may be a mobile system. In some example embodiments, the mobile system may be a portable computer, a web tablet, a mobile phone, a digital music player, or a memory card.

The controller 1110 may control an executable program in the system 1100. The controller 1110 may include a microprocessor, a digital signal processor, a microcontroller, or a device similar thereto.

The input/output device 1120 may be used to input or output data of the system 1100. The system 1100 may be connected to an external device, e.g., a personal computer or a network, via the input/output device 1120 and may exchange data with the external device. The input/output device 1120 may include, for example, a touch pad, a keyboard, or a display.

The memory 1130 may store data for operation of the controller 1110 or data processed by the controller 1110. The memory 1130 may include any of the semiconductor packages 100 and 200 described with reference to FIGS. 1A, 1B, 1C, 1D, 2A and 2B.

The interface 1140 may be a data transmission path between the system 1100 and an external device. The controller 1110, the input/output device 1120, the memory 1130, and the interface 1140 may communicate with one another via the bus 1150.

While the inventive concept has been particularly shown and described with reference to example embodiments thereof, it will be understood that various changes in form and details may be made therein without departing from the spirit and scope of the following claims.

What is claimed is:

1. A wire bonding method for connecting a first pad and a second pad, the wire bonding method comprising:

forming a ball part by bonding a free air ball created at a first end of a wire to the first pad using a capillary;

forming a neck part on the ball part by vertically moving the capillary away from the first pad;

substantially leveling at least a portion of a top surface of the neck part by moving the capillary horizontally toward the second pad while a bottom surface of the capillary and the top surface of the neck part are at a common level;

forming a wire part by vertically moving the capillary toward the first pad, the wire part being connected to the neck part; and extending and bonding the wire part to the second pad by moving the capillary to the second pad, wherein a pressed region of the wire part has a V-shape and is in contact with the neck part, a side surface of the ball part and the first pad, and wherein the substantially leveling of the at least the portion of the top surface of the neck part comprises substantially leveling all of the top surface of the neck part such that the wire part does not cover the top surface of the neck part and is in contact with a side surface of the neck part.

2. The wire bonding method of claim 1, wherein a bottom surface of the pressed region is in contact with a top surface of the first pad alongside a bottom surface of the ball part in a side cross-sectional view.

3. The wire bonding method of claim 1, wherein, in a plan view, a diameter of the ball part is greater than a diameter of the neck part, the diameter of the neck part is less than a maximum width of the pressed region of the wire part, and the maximum width of the pressed region of the wire part is greater than a diameter of a normal region of the wire part.

4. The wire bonding method of claim 1, wherein the forming of the wire part comprises forming the wire part to be in contact with the top surface of the neck part, a side surface of the neck part, the side surface of the ball part, and a top surface of the first pad.

5. The wire bonding method of claim 4, wherein the pressed region is in contact with the top surface of the first pad such that a top surface of the wire part is at a lowest level in the pressed region.

6. The wire bonding method of claim 5, wherein a shape of the pressed region is symmetrical with an outer shape of the capillary.

7. The wire bonding method of claim 1, wherein the capillary does not move in a direction from the second pad to the first pad.

8. The wire bonding method of claim 1, further comprising forming a stitch part at a second end of the wire part after the bonding of the wire part, the stitch part being directly bonded to the second pad.

9. The wire bonding method of claim 8, wherein the wire is bonded to the first pad using a ball bonding method and is bonded to the second pad using a stitch bonding method.

10. The wire bonding method of claim 1, wherein the forming of the neck part on the ball part comprises the capillary being vertically moved up to a height corresponding to a first distance about 35 μm to about 40 μm from the first pad.

11. The wire bonding method of claim 1, wherein the substantially leveling of the at least the portion of the top surface of the neck part comprises the capillary being horizontally moved toward the second pad by a second distance about 35 μm to about 45 μm from a center of the neck part.

12. The wire bonding method of claim 1, wherein the forming of the wire part comprises the capillary being moved down perpendicular to a top surface of the first pad by a third distance about 20 μm to about 30 μm from the top surface of the neck part.

13. The wire bonding method of claim 1, wherein the substantially leveling of the at least the portion of the top surface of the neck part comprises removing the wire part from all of the top surface of the neck part.

14. The wire bonding method of claim 1, wherein the top surface of the neck part is substantially flat.

15. A wire bonding method for connecting a first pad and a second pad, the wire bonding method comprising:
   forming a ball part by bonding a free air ball created at a first end of a wire to the first pad using a capillary;
   forming a neck part on the ball part by vertically moving the capillary away from the first pad;
   substantially leveling at least a portion of a top surface of the neck part by moving the capillary horizontally toward the second pad while a bottom surface of the capillary and the top surface of the neck part are at a common level;
   forming a wire part by vertically moving the capillary toward the first pad, the wire part being connected to the neck part; and
   extending and bonding the wire part to the second pad by moving the capillary to the second pad,
   wherein a pressed region of the wire part has a V-shape and is in contact with the neck part, a side surface of the ball part and the first pad,
   wherein the top surface of the neck part is substantially flat, and
   wherein the substantially leveling of the at least the portion of the top surface of the neck part comprises substantially leveling the top surface of the neck part such that the wire part does not cover all of the top surface of the neck part and is in contact with a side surface of the neck part.

16. The wire bonding method of claim 15, wherein the substantially leveling of the at least the portion of the top surface of the neck part comprises removing the wire part from all of the top surface of the neck part.

17. A wire bonding method for connecting a first pad and a second pad, the wire bonding method comprising:
   forming a ball part by bonding a free air ball created at a first end of a wire to the first pad using a capillary;
   forming a neck part on the ball part by vertically moving the capillary away from the first pad;
   moving the capillary horizontally toward the second pad to expose at least a portion of a top surface of the neck part while a bottom surface of the capillary and the top surface of the neck part are at a common level;
   forming a wire part by vertically moving the capillary toward the first pad, the wire part being connected to the neck part; and
   extending and bonding the wire part to the second pad by moving the capillary to the second pad,
   wherein a pressed region of the wire part has a V-shape and is in contact with the neck part, a side surface of the ball part and the first pad, and
   wherein the moving the capillary horizontally toward the second pad results in the wire part not covering all of the top surface of the neck part and the wire part being in contact with a side surface of the neck part.

18. The wire bonding method of claim 17, wherein the top surface of the neck part is substantially flat.

\* \* \* \* \*